United States Patent
Xu et al.

(10) Patent No.: US 8,462,556 B1
(45) Date of Patent: Jun. 11, 2013

(54) METHOD FOR OPERATING A HIGH DENSITY MULTI-LEVEL CELL NON-VOLATILE FLASH MEMORY DEVICE

(75) Inventors: Yue Xu, Jiangsu (CN); Feng Yan, Jiansu (CN); Ling Pu, Jiangsu (CN); Xiaoli Ji, Jiangsu (CN)

(73) Assignee: Nanjing University, Nanjing, Jiangsu (CN)

( * ) Notice: Subject to any disclaimer, the term of this patent is extended or adjusted under 35 U.S.C. 154(b) by 13 days.

(21) Appl. No.: 13/327,586

(22) Filed: Dec. 15, 2011

(51) Int. Cl.
*G11C 11/40* (2006.01)
*G11C 16/04* (2006.01)

(52) U.S. Cl.
USPC ............ 365/185.27; 365/185.03; 365/185.18; 365/185.24; 365/184

(58) Field of Classification Search
USPC ............. 365/185.03, 185.18, 185.24, 185.27, 365/184
See application file for complete search history.

(56) References Cited

U.S. PATENT DOCUMENTS

| | | | |
|---|---|---|---|
| 6,313,486 B1 * | 11/2001 | Kencke et al. | 257/192 |
| 6,731,544 B2 * | 5/2004 | Han et al. | 365/185.28 |
| 6,747,899 B2 * | 6/2004 | Hsia et al. | 365/185.28 |
| 2002/0167843 A1 * | 11/2002 | Hsia et al. | 365/185.28 |
| 2002/0167844 A1 * | 11/2002 | Han et al. | 365/185.28 |
| 2005/0237801 A1 * | 10/2005 | Shih | 365/185.11 |
| 2005/0237809 A1 * | 10/2005 | Shih et al. | 365/185.18 |
| 2005/0237815 A1 * | 10/2005 | Lue et al. | 365/185.28 |
| 2005/0237816 A1 * | 10/2005 | Lue et al. | 365/185.28 |
| 2007/0133307 A1 * | 6/2007 | Hsu et al. | 365/185.29 |
| 2007/0253258 A1 * | 11/2007 | Hsu et al. | 365/185.29 |

* cited by examiner

*Primary Examiner* — Hoai V Ho
*Assistant Examiner* — Jay Radke
(74) *Attorney, Agent, or Firm* — Global IP Services; Tianhua Gu (57) ABSTRACT

A localized trapping multi-level memory cell operating method includes the following steps. First, a localized trapping memory cell with the initial threshold voltage of approximately 2.5V is provided. Next, an erasing operation is performed to obtain a negative threshold level having uniform charge distribution along the channel region. Taking into account the over-erasure issue in the erasing operation, a programming operation is performed to precisely adjust the threshold voltage to a predetermined level of −2V to −1V. Then, with this negative voltage as a new initial state, a corresponding programming operation is performed and electrons are locally injected into the storage layer. By controlling the quantity of injected electrons, the MLC storage is achieved.

9 Claims, 5 Drawing Sheets

METHOD FOR OPERATING A HIGH DENSITY MULTI-LEVEL CELL NON-VOLATILE FLASH MEMORY DEVICE

BACKGROUND OF THE INVENTION

1. Field of the Invention

The invention relates to a method for operating a non-volatile flash memory, and more particularly to a programming and erasing method for a localized charge trapping memory using a high density multi-level cell.

2. Description of the Related Art

Presently, non-volatile flash memory devices have been widely used for portable electronics, such as MP3 players, digital cameras, personal digital assistants, mobile phones and laptop computers, etc. High-capacity and low-cost flash memory devices are in great demand. Thus, increasing the storage capacity and reducing the manufacturing cost become the main targets for the memory manufacturers. As the memory fabrication approaches physical limits in terms of device miniaturization increasing the memory density of devices by simply scaling down the size of the memory cell becomes more and more difficult. By contrast, the more effective method to increase the storage capacity is to apply multi-level cell (MLC) techniques, which have attracted much research efforts in recent years. Unlike a single-level cell (SLC), which stores one bit in each cell, the MLC can store multiple bits in each cell. In this method, the bit state stored in the memory is characterized by the number of charges, using charge carriers to change the threshold voltage of the memory cell and read the value of the current to determine the stored bits. In order to accurately read out the stored bits, threshold voltage distributions of a programmed state need to be spaced apart from each other. Limited by the whole memory window, if MLC device achieves more than 3 bits/cell storage, the allowable distribution width of each state is very narrow and the spacing between different threshold voltage distributions is also very narrow. Moreover, the current memory programming methods cannot program the memory cell to the precise threshold level. Therefore, different threshold levels tend to overlap so that bit state determination becomes very difficult. Moreover, due to the narrow threshold voltage distribution width of each state, the degradation of program/erase cycling endurance and retention for the memory with MLC become problematic. Therefore, the reliability issues of MLC limit the further applications of MLC technique.

Localized charge trapping polysilicon-oxide-nitride-oxide-silicon (SONOS) can locally store 1 bit at source and drain side of each memory cell, respectively. NROM as a typical localized trapping SONOS memory device achieves 2 bits, referred to U.S. Pat. No. 7,110,300. If NROM cell uses four-level storage at the each side of cell, it can realize 4 bits storage per cell, which greatly increases the storage capacity and reduces the cost. The initial threshold voltage of NROM is about 2-3V and the highest programmed threshold voltage is about 5-6V. So, the whole memory window limits to about 3 V. If NROM achieves 3 bits storage at the each side of cell, there will be eight threshold levels in a 3 V memory window. Thus, the allowable threshold voltage distribution width of each state is less than 0.3 V. It is difficult to program the NROM cell to such a precise threshold level by using the conventional channel hot electron (CHE) injection programming technique.

Since it is difficult to achieve more than 8-level 3 bits high density storage at the each side of memory cell using the traditional MLC operating method, it is very urgent to invent new multi-level cell operating methods to increase storage density. Meanwhile, it is also an important subject to improve the accuracy of program/erase operation and increase the reliability of MLC operation, i.e. program/erase cycling endurance and retention.

SUMMARY OF THE INVENTION

The invention is directed to a new high density memory operating method for localized trapping Flash memory. Based on the method, the memory window of the developed MLC has at least twice the memory window of the conventional MLC and an eight-level 3-bit storage at the each side of cell is achieved. This operating method not only greatly enhances the storage capacity, but also improves the endurance and retention with the same reliability as the four-level cell.

According to the present invention, a localized trapping memory cell operating method is provided, which includes the following steps:

(a) Erasing the localized trapping memory cell with initial threshold voltage of about 2-3V to a new initial level of about −2 to −1V. After erasing, the bits at each side of the cell have the same threshold level, and a uniform charge distribution in the nitride layer along the channel is obtained.

(b) Performing an MLC programming operation for the localized trapping memory cell with the state of the negative threshold voltage of about −2 to −1 V as a new initial state. This invention uses a CHE injection with a positive substrate bias to suppress the secondary electron injection, or a pulse agitated substrate hot electron injections (PASHEI) programming method to implement the charge localized storage.

(c) Changing the gate or drain voltage or the programming time such that more than eight programming states are achieved, i.e. more than eight threshold voltage levels are achieved.

In step (a), in order to prevent over-erasing, i.e. the erased threshold voltage being less than the predetermined negative level, an impact ionization generated substrate hot electron (IIHE) programming method is applied. During the IIHE programming, two equal positive voltages are applied on the source and drain simultaneously, and a positive voltage is applied on the gate, while the substrate is grounded. The substrate hot electrons are generated from impact of accelerated hot hole and are uniformly injected into the storage layer. As a result, the threshold voltage increases and charge is uniformly distributed along a channel region of the memory cell. When a double side IIHE programming method is used, i.e. a pulse of 4-8V is applied to the gate, and a bias with 4-6V is applied to the source and drain and substrate is grounded. Substrate hot electrons are generated from impact ionization of accelerated hot holes coming from the source and drain. The generated electrons in the source and drain region are accelerated towards the gate by forward vertical electric field. After they obtain enough energy, they inject into the storage layer through the tunneling layer and recombine with the trapped electrons. As a result, the threshold voltage of the memory cell increases. The double side IIHE programming ensures uniform charge distribution and threshold voltage distribution along the channel is obtained. When a double side BBHH erasing method is used, i.e. a pulse of −8 to −4V is applied to the gate, a bias of 4-6V is applied to the source and drain and substrate is grounded. The generated holes in the source and drain region are accelerated by reverse electric field. They obtain enough energy to inject into the storage layer through the tunneling layer and recombine with the trapping electrons. When a great number of holes are trapped in the storage layer, the threshold voltage of the memory cell reaches the negative level. The erasing operation may also be performed by a negative Fowler-Nordheim (FN) mechanism. In this case, a bias of −12 to −8V is applied to the gate, and the source, drain, and substrate are grounded, When the electric field in the tunneling layer reaches more than 10 MV/cm, holes are injected into the storage layer by the FN tunneling mechanism. When a great number of holes are trapped in the storage layer, the threshold voltage of the memory cell reaches a negative level.

In step (b), when the channel hot electron (CHE) injection with positive substrate bias is applied, approximately 2V is applied to the substrate, 3-5V and 5-8V are applied to drain and gate, respectively, with source grounded. When the PASHEI programming method is applied, it consists of two stages. In the first stage, a −2 V pulse is applied between drain and substrate, approximately 0.2V is applied to the gate, and source is grounded. In the second stage, a 2.5-4V pulse is applied between drain and substrate, 4-5V is applied to gate, and source is grounded. The programming operation may also be performed by the FN programming mechanism, wherein a bias with 8-12V is applied to the gate, and the source, drain, and substrate are grounded. When the electric field in the tunneling layer reaches more than 10 MV/cm, the electrons are injected into the storage layer by FN tunneling. As a result, the threshold voltage of the memory cell increases.

As the conventional single side band-to-band tunneling hot hole (BBHH) injection erasing cannot achieve uniform charge distribution along channel region, a double-side BBHH erasing technique is applied in this invention. During the double-side BBHH erasing, two same positive voltages are applied on the source and drain simultaneously, and a negative voltage is applied on the gate, substrate is grounded. So, electrons distributing in the storage layer can be uniformly erased. In order to prevent the over-erase operation, i.e. the erased threshold voltage less than the predetermined negative level, an impact ionization generated substrate hot electron (IIHE) programming operation is applied. During the IIHE programming, two same positive voltages are applied on the source and drain simultaneously, and a positive voltage is applied on the gate, substrate is grounded. The substrate hot electrons are generated from impact of accelerated hot hole and are uniformly injected into the storage layer. As a result, the threshold voltage increases and charges uniformly distributes along channel region.

After the threshold voltage of memory cell is adjusted to a predefined level of −2 V∼−1 V by double-side BBHH erasing and IIHE programming, then, with the state of the negative threshold voltage as a new initial state the MLC programming operation for the localized trapping memory cell is performed. For the memory cell with the negative threshold voltage, the excess holes uniformly trapped in the storage layer, which make the electrons more easily inject into the channel central region when a conventional CHE programming mechanism is applied. Thus, the trapped electrons have the more wide distribution in the storage layer, and it is difficult for the memory cell to return to the erased state by using the localized BBHH erase mechanism.

This invention uses a CHE injection with a positive substrate bias suppressing the secondary electron injection or a pulse agitated substrate hot electron injection (PASHEI) programming method to implement the localized charge storage. When the CHE programming with positive substrate bias is applied, −2V is applied to the substrate, 3-5V is applied to the drain, 5-8V is applied to the gate, and the source is grounded. As the substrate is positively biased, the secondary electron injection is suppressed so that hot electrons inject into the storage layer near the drain side and localized charge storages are achieved. By changing the gate or drain voltage or the programming time, eight programming states, i.e. eight threshold voltage levels can be achieved. Since the maximum threshold voltage of the programmed state is still 5-6V, the whole memory window of the developed multi-level cell has nearly doubled over that of the conventional multi-level cell. If the eight-level and 3 bits storage is achieved at the each side of cell, the threshold voltage distribution width of each state can range up to 0.7V. Moreover, there is an enough space between different threshold voltage distributions.

The MLC programming is also performed by PASHEI programming method. The total PASHEI programming course consists of two stages. During the first stage, a −2 V pulse is applied between drain and substrate, gate is applied to ∼0.2V, and source are tied to the ground. Because the PN junction between substrate and drain is forward biased, huge amounts of electrons are generated and injected into the substrate. After the first stage, the drain voltage quickly changes to 2.5-4V in a short transition time, the gate is applied to 4V∼5 V, and the source and substrate is still grounded. From the first programming stage to the second programming stage, the PN junction between the substrate and the drain becomes to reverse biased, a wide depletion region is formed near the drain junction. So, the generated electrons in the substrate region at the first stage are injected into the depletion region of drain junction by the reverse electric field. The injected electrons are accelerated in the drain depletion region and impact ionization with lattice to create a significant amount of electron-hole. Some electrons gain enough energy over $Si/SiO_2$ barrier and inject into the storage layer near the drain edge by the perpendicular electric field. The amount of charges injected into the storage layer is controlled by the slightly changing drain bias so as to achieve MLC storage. For the different programmed states of MLC using the CHE with positive substrate bias or the PASHEI programming mechanisms, they can be return to the erased state with a negative threshold voltage using single-side BBHH erasing mechanism. After erasing, there is a validation step. If the threshold level of the erased cell is higher than the erased predetermined level, the erase operation continues. Otherwise, there is a phenomenon of over-erasure.

In summary, this invention proposes a new MLC operating method which is divided into two processes. First, the threshold voltage of memory cell is uniformly erased to −2 to −1V. Then, with the state of the negative threshold voltage as a new initial state, the appropriate programming and erasing technologies for local programming and erasing are selected. As a result, the memory window of the developed multi-level cell has nearly doubled over that of the conventional multi-level cell. An eight-level 3-bit storage at the each side of cell is achieved, which has an almost the same reliability characteristics with the 2 bits four-level cell. Therefore, it can greatly increase storage density without the additional cost.

This invention about MLC operating method has several following outstanding advantages compared to the present MLC techniques:

(1) Large memory window of MLC;
(2) Wide threshold voltage distribution of each programming state;
(3) Wide spacing between different threshold voltage distributions and different threshold voltage distributions separating apart each other;
(4) Good characteristics of program/erase endurance and retention;
(5) High storage density, at least 1.5 times more than present storage density;

(6) Low voltage programming and erasing operation, simple implementation with low cost.

DETAILED DESCRIPTION OF THE INVENTION

The convention MLC operation for localized trapping nonvolatile Flash memory is performed by using CHE programming mechanism with a initial state of 2-3V. By controlling the gate and drain voltage or programming time, four-level storage states, i.e 2 bits storage at the each side of cell can be achieved based on a approximately 3V memory window. The electrons locally trapping above the drain junction can be erased by using the single side BBHH erasing mechanism.

Figure 1:
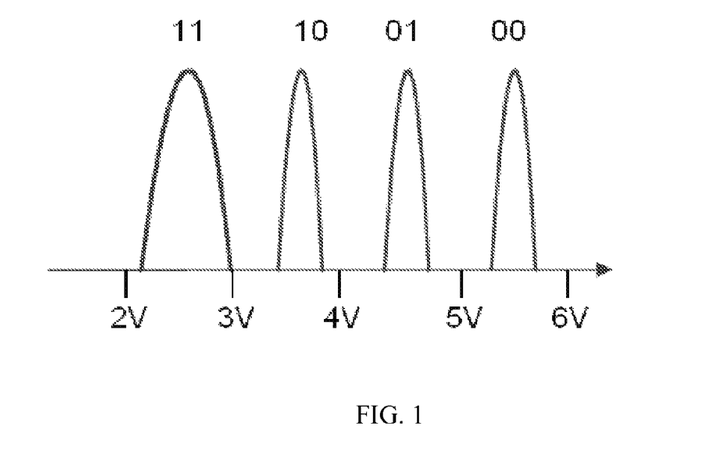
FIG. 1 is a schematic illustration showing a threshold voltage distribution of conventional MLC.

Using the typical localized trapping memory device NROM as an embodiment, if it achieves four-level i.e. 2 bits storage at the each source or drain side, the allowable distribution width of the threshold voltage is about 0.7 V, as schematically shown in FIG. 1. If it achieves more than eight-level storage at the each side of cell, it would be difficult to be implemented due to the limitation of the precise programming techniques and reliability problems.

Figure 2:
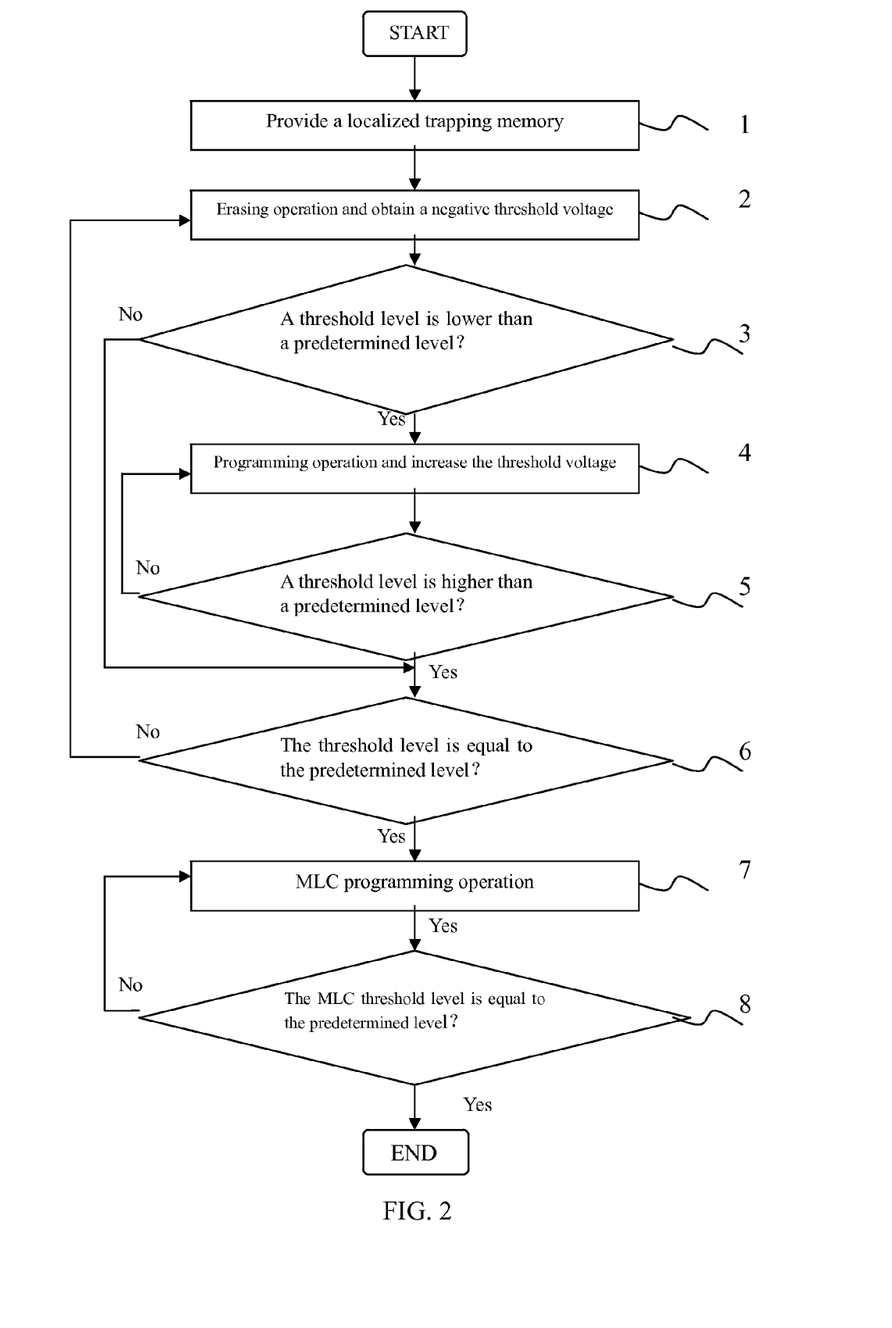
FIG. 2 is a flow chart showing a memory operating method according to a preferred embodiment of the invention.

This invention proposes a new MLC operating method. It has at least twice the memory window of the traditional MLC and achieves 3 bits storage at the each side of cell. It can greatly enhance the storage density and prevent the different bits overlap. In addition, it improves the reliability of MLC operation. FIG. 2 is a flow chart showing a memory MLC operating method according to a preferred embodiment of the invention. First, a uniform erasing operation is performed for the memory cell with 2V-3V initial threshold voltage. As a result, the memory cell is erased to a new initial state with a −2V to −1V threshold voltage. Meanwhile, the charges uniformly trap in the storage layer along the channel region. Taking into account the over-erasure problem during the erasing, the threshold voltage of memory cell is accurately adjusted to −2V to −1V by using the programming operation. Then, with the state of the negative threshold level as a new initial state, MLC programming operation is performed by using charge carriers to change the threshold level of memory cell with different programming conditions. Finally, the bits can be determined by reading the value of the current. It is noted that the stored charges can be locally erased by BBHH erasing mechanism and the memory cell can return to the erased state with negative threshold voltage. The detailed operating flow in FIG. 2 is described as following.

Figure 3:
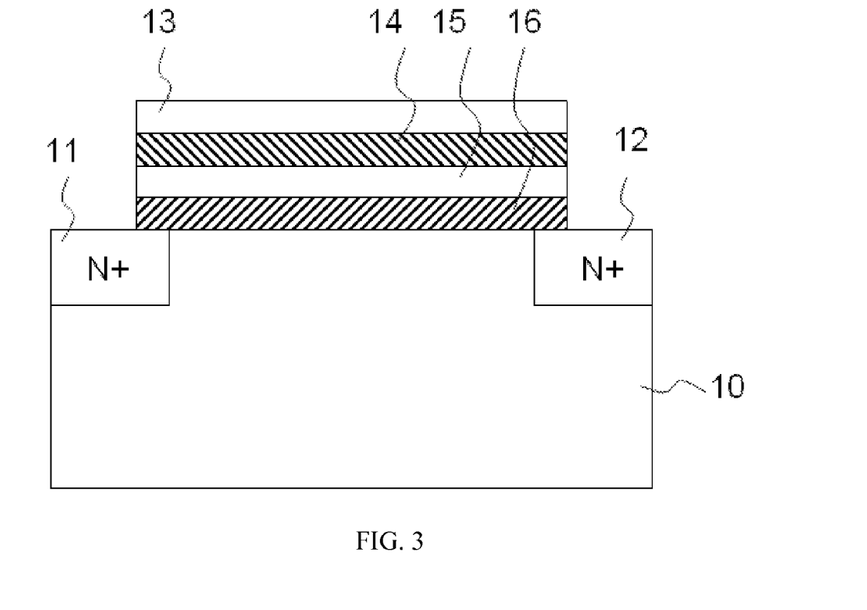
FIG. 3 is a schematic illustration showing the structure of localized trapping memory cell.

First, as shown in step 1, a localized trapping memory, such as the memory in FIG. 3, is provided. The memory may be memory cell in a memory array. An N-type source region 11 and an N-type drain region 12 are located above both side of the P-type substrate 10. The channel region is positioned between the source 11 and drain region 12. The tunneling layer 16, charge storage layer 15 and block layer 14 are positioned above the channel region in turn, and the gate 13 is disposed on the block layer.

Figure 4:
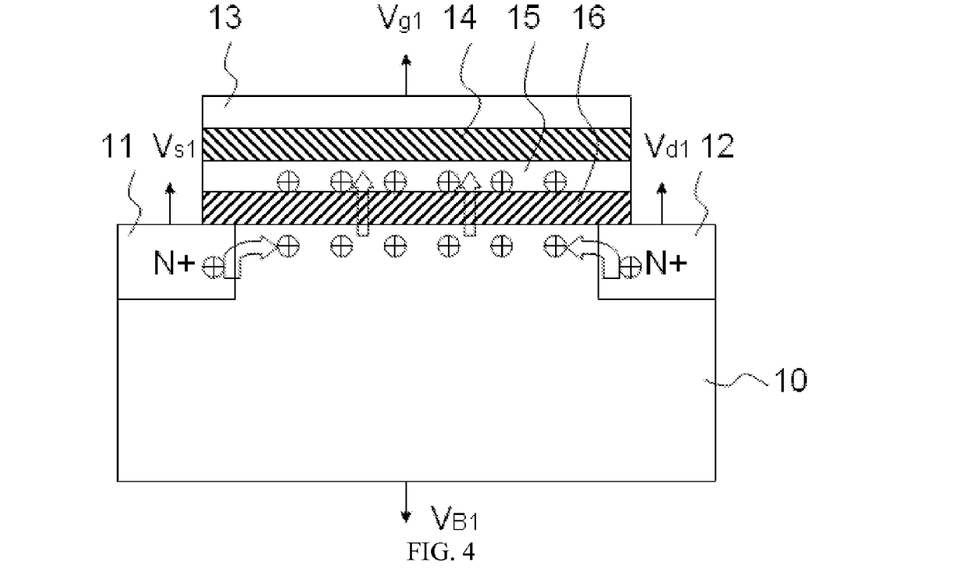
FIG. 4 is a schematic illustration showing an erasing step of memory with negative threshold voltage according to the preferred embodiment of the invention.

Next, as shown in step 2, the memory cell is erased from the initial threshold voltage of 2-3V to −2V to −1V. As shown in FIG. 4, a bias $V_{g1}$ is applied to the gate 13 and biases $V_{s1}$ and $V_{d1}$ are respectively applied to the source 11 and drain 12, and the substrate 10 is grounded such that the holes are generated and uniformly injected into the charge storage layer 15. The threshold level decreases as the erasing time and changes from the initial 2-3V to −2V to −1V. The object of the step 1 is mainly to set the memory to a new initial state to facilitate the subsequent MLC operation.

The step 2 may be performed by a double side BBHH erasing mechanism. As shown in FIG. 4, when the bias $V_{g1}$ applied to the gate 13 ranges from −4V to −8V, and each of the biases $V_{s1}$ and $V_{d1}$ applied to the source 11 and drain 12 range from 4-6V with substrate grounded. The generated holes in the source 11 and drain region 12 are accelerated by reverse electric field. They obtain enough energy to inject into the storage layer 15 through the tunneling layer 16 and recombine with the trapping electrons. When a great amount of holes traps in the storage layer, the threshold voltage of memory cell becomes to the negative level. As the channel length of the mainstream memory cell is less than 0.13 μm, the double side BBHH erasing method can ensure the charges uniformly distribute and the uniform threshold voltage distribution along the channel region is obtained. However, the technology of the invention is not limited thereto. Herein, the step 2 may also be performed by a negative Fowler-Nordheim (FN) erasing operation. In this case, bias $V_{g1}$ applied to the gate 13 ranges from −8V to −12V, and the biases $V_{s1}$, $V_{d1}$ and $V_{b1}$ respectively applied to the source 11, drain 12 and substrate 10 are both substantially equal to 0V. When the electric field in the tunneling layer reaches more than 10 MV/cm, the holes inject into the storage layer 15 by FN tunneling. As a result, the threshold voltage of memory cell decreases and threshold voltage along the channel has the same distribution.

Then, as shown in step 3, it is verified whether the threshold level of the erased cell in the step 2 is higher than the predetermined erase level. If the threshold level of the memory is higher than the predetermined erase level, the step 6 is performed. If the threshold level of the memory is lower than the predetermined erase level, there exists over-erasure phenomenon. So, the procedure goes back to the step 4.

Figure 5:
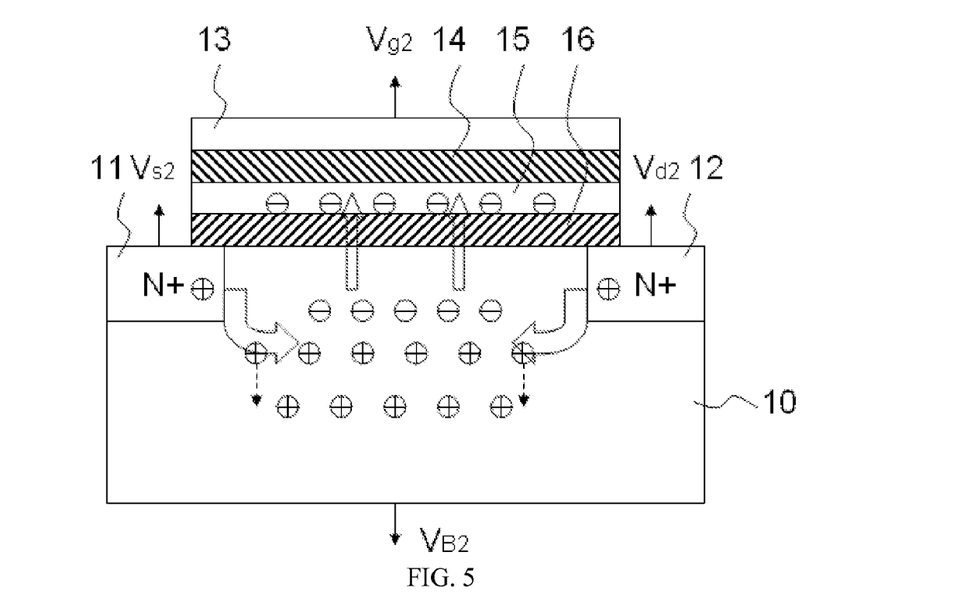
FIG. 5 is a schematic illustration showing a programming step of memory after over-erasure in FIG. 4 according to the preferred embodiment of the invention.

Next, as shown in step 4, the electrons are injected in storage layer. The schematic illustration of programming operation is shown in FIG. 5. A bias $V_{g2}$ is applied to the gate 13 and biases $V_{s2}$ and $V_{d2}$ are respectively applied to the source 11 and drain 12, and the substrate 10 is grounded such that the electrons are generated and uniformly injected into the charge storage layer 15. The threshold level increases as the time, and the threshold level is precisely adjusted to −2 to −1V after over-erasure.

The step 4 may be performed by a double side IIHE programming mechanism. As shown in FIG. 5, when the bias Vg2 applied to the gate 13 ranges from 4V to 8V, and each of the biases Vs2 and Vd2 applied to the source 11 and drain 12 range from 4-6V and the substrate 10 is grounded (VB2=0V). The substrate hot electrons are generated from impact ionization of accelerated hot holes coming from the source and drain. The generated electrons are accelerated towards the gate by forward vertical electric field. After they obtain enough energy, they inject into the storage layer through the tunneling layer and recombine with the trapped electrons. As a result, the threshold voltage of memory cell increases. However, the technology of the invention is not limited thereto. Herein, the step 4 may also be performed by FN programming operation. In this case, bias $V_{g2}$ applied to the gate 13 ranges from 8V to 12 V, and the biases $V_{s2}$, $V_{d2}$ and $V_{b2}$ respectively applied to the source 11, drain 12 and substrate 10 are substantially equal to 0V. When the electric field in the tunneling layer 16 reaches more than 10 MV/cm, the electrons inject into the storage layer 15 by FN tunneling. As a result, the threshold voltage of memory cell increases.

Then, as shown in step 5, it is verified whether the threshold level of the programmed cell is higher than the predetermined threshold voltage in the step 4. If the threshold level of the memory is lower than the predetermined threshold voltage, the procedure goes back to the step 4 and continues to programming operation. Otherwise, the step 6 is performed.

Next, as shown in step 6, it is verified whether the threshold level of the memory cell in step 2 or step 4 enters into the predetermined threshold voltage range. If the threshold level of the memory enters into the predetermined threshold voltage range, the step 7 is performed. Otherwise, the procedure goes back to the step 2 to perform the erasing operation.

Figure 6A:
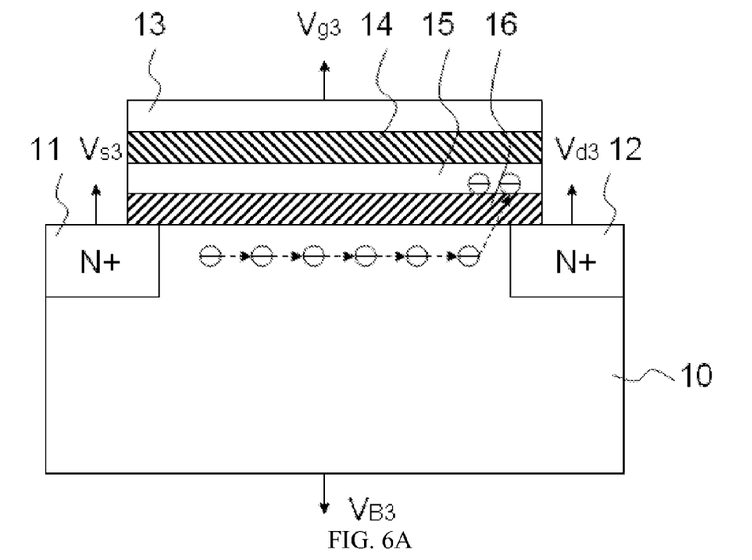
FIG. 6A is a schematic illustration showing a CHE programming step with positive substrate bias to achieve different threshold voltages based on erased state with a negative threshold voltage.
Figure 6B:
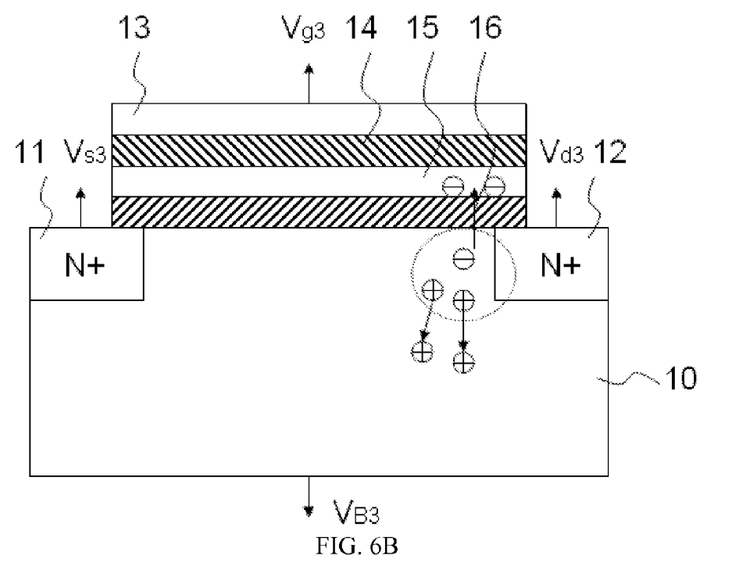
FIG. 6B is a schematic illustration showing a PASHEI programming step to achieve different threshold voltages based on erased state with a negative threshold voltage.

Then, as shown in step 7, the MLC programming is performed with the state of the negative threshold voltage as a new initial state. The detailed schematic illustration of MLC programming is shown in FIG. 6A and FIG. 6B. A bias $V_{g3}$ is applied to the gate 13 and biases $V_{s3}$ and $V_{d3}$ are respectively applied to the source 11 and drain 12, and the substrate 10 is grounded (VB3=0V). such that the electrons are generated and locally injected into the charge storage layer 15 above the drain junction. Using electrons to change the threshold level of the memory cell by applying different drain voltage level or programming time, MLC storage is achieved.

The step 7 may be performed by a CHE injection with positive substrate bias to prevent the second hot electron injection. As shown in FIG. 6A, when the bias $V_{b3}$ tied to substrate 10 is about 2V, $V_{d3}$ applied to the drain 12 ranges from 3V to 5V, $V_{g3}$ applied to the gate 13 ranges from 5V to 8V, and the source 11 is grounded. As the substrate 10 is applied to positive bias, the second hot electron injection is effectively suppressed. As a result, hot electrons are injected the storage layer 15 only near the drain junction, which improves the performances of the localized charge storage. By changing the drain 12 programming voltage or programming time, more than eight programmed states can be obtained. Thus, the memory window of the developed multi-level cell has nearly doubled over that of the conventional multi-level cell. If an eight-level 3-bit storage at the each side of cell is achieved, the distribution width of each threshold voltage can reach 0.7V and there has enough spacing between the different threshold voltage distributions.

Figure 7:
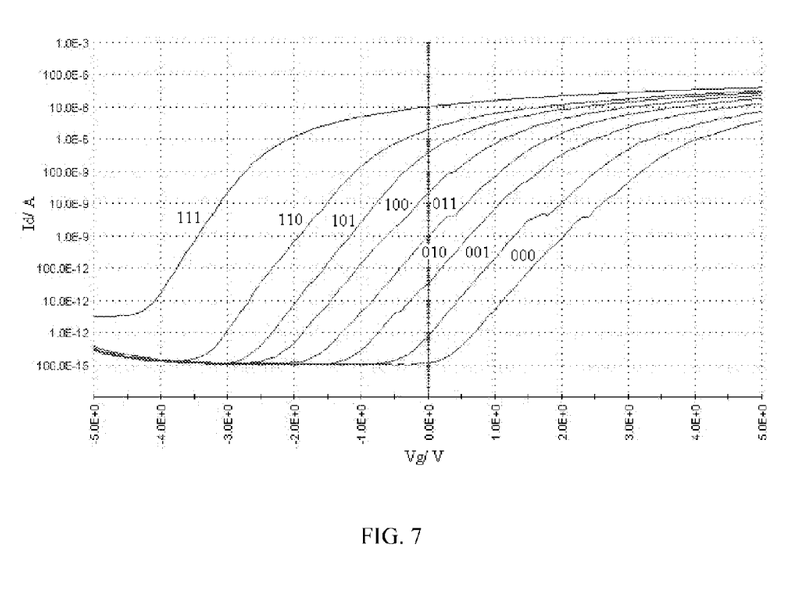
FIG. 7 is the measured $I_{ds}$-$V_{ds}$ curves of eight different programming states after MLC programmed operation according to the preferred embodiment of the invention.

However, the technology of the invention is not limited thereto. Herein, the step 7 may also be performed by PASHEI programming method. In this case, the programming course is divided into two stages. During the first stage, a −2 V pulse is applied to drain 12, gate 13 is tied to 0.2V and substrate 10 and source 11 are grounded. Because the PN junction between drain 12 and substrate 10 is forward biased, huge amounts of electrons are generated. Next, the programming enters the second stage. The drain 12 voltage quickly changes to 2.5V~4V in a short time and the gate 13 voltage also increases to 4V~5V. So, the junction between the substrate 10 and drain 12 quickly changes from the forward bias to reverse bias. Then, the generated electrons in the first stage are injected into the depletion region of drain junction by the reverse electric field. The injected electrons are accelerated in the drain depletion region and a plenty of electron-hole pairs are generated by impact ionization. Some electrons gain enough energy over $Si/SiO_2$ barrier and inject into the nitride layer 15 near drain edge by the perpendicular electric field. By slightly changing the drain 13 voltage in the second stage to control the quantity of the injected electrons, the MLC storage can be obtained. A NROM cell fabricated in 90 nm technology is performed the MLC operation as a preferred embodiment of the invention. It achieves 3 bits, i.e. eight different storage states at the each side of the cell. The measured $I_{ds}$-$V_{ds}$ curves of eight different programming states after MLC programming operations are illustrated in FIG. 7. It can be clearly seen the different states are obviously separated apart and there is enough spacing between the different states.

Finally, as shown in step 8, it is verified whether the threshold level of the MLC reaches the predetermined programming level in the step 7. If the threshold level reaches the predetermined programming level, the procedure is completed. Otherwise, the step 7 is performed.

This invention uses a single side BBHH erasing mechanism to erase the programmed states of MLC devices to the erased state with a negative threshold voltage. After erasing there is a validation step. If the threshold voltage of the erased state is less than the erased predetermined level, the erasing operation stops.

Above described high density MLC operation methods are applicable to all kinds of material and structure of the localized trapping non-volatile memory devices.

What is claimed is:

1. A Method for operating a high density multi-level cell non-volatile flash memory possesses the following operating steps:
   (a) erasing a localized trapping memory cell with an initial threshold voltage of about 2-3V to a new initial threshold voltage level of about −2 to −1 V, wherein, after the erasing, stored bits at each side of the cell have a same threshold level, and a uniform charge distribution in a nitride layer along the channel is obtained;
   (b) performing an MLC programming operation on the localized trapping memory cell with the state of the negative threshold voltage of about −2 to −1 V as the new initial threshold voltage level, wherein a channel hot electron CHE injection programming method is used with a positive substrate bias to suppress a secondary electron injection; and
   (c) changing a gate or a drain voltage or a programming time such that more than eight programming states are achieved i.e. more than eight threshold voltage levels are achieved.

2. The method according to claim 1, wherein the step (a) is performed by a double-side band-to-band tunneling hot hole (BBHH) erasing method, wherein two equal positive voltages are applied on a source and the drain simultaneously, and a negative voltage is applied to a gate, while a substrate is grounded, thereby electrons trapped in a storage layer are uniformly erased.

3. The method according to claim 1, wherein step (a), in order to prevent over-erasing, i.e. an erased threshold voltage being less than a predetermined negative level, an impact ionization generated substrate hot electron (IIHE) programming method is applied, during the IIHE programming, two equal positive voltages are applied on a source and a drain simultaneously, and a positive voltage is applied on a gate, while a substrate is grounded, substrate hot electrons are generated from impact of accelerated hot hole and are uniformly injected into a storage layer, as a result, the threshold voltage increases and uniformly distributes along channel region.

4. The method according to claim 1, wherein the step (b) when the channel hot electron (CHE) injection with the positive substrate bias is applied, approximately 12V is applied to a substrate, 3-5V and 5-8V are applied to a drain and a gate, respectively, with a source grounded.

5. The method according to claim 2, wherein the double side BBHH erasing method comprises applying a pulse of −8 to −4V to the gate, a bias of 4-6V to the source and the drain and the substrate is grounded, wherein generated holes in the source and the drain region are accelerated by a reverse electric field, they obtain enough energy to inject into the storage layer through a tunneling layer and recombine with the trapping electrons, when the great number of holes are trapped in the storage layer, the threshold voltage of memory cell reaches the negative level.

6. The method according to claim 3, wherein a double side IIHE programming method comprises applying a pulse of 4-8V to the gate, and a bias of 4-6V to the source and the drain and the substrate is grounded, wherein substrate hot electrons are generated from impact ionization of accelerated hot holes coming from the source and drain, generated electrons in the source and drain region are accelerated towards the gate by forward vertical electric field, after they obtain enough energy, they inject into the storage layer through the tunneling layer and recombine with the trapped electrons, as a result, the threshold voltage of memory cell increases, the double side IIHE programming ensures uniform charge distribution and threshold voltage distribution along a channel is obtained.

7. The method according to claim 4, wherein a CHE injection programming with positive substrate bias to prevent a second hot electron injection, i.e. approximately 2V is applied to the substrate, 3-5V is applied to the drain, 5-8V is applied to the gate, and the source is grounded, as a positive bias is applied to the substrate, the second hot electron injection is effectively suppressed, as a result, hot electrons are injected into the storage layer only near the drain junction, which improves the performances of the localized charge storage such that MLC storage can be obtained and for different programmed states of MLC using the CHE with the positive substrate bias, a single side BBHH erasing mechanism is used to erase the programmed states of MLC devices to the erased state with a negative threshold voltage.

8. The method according to claim 2, wherein there is a validation step, if a threshold voltage of an erased cell is higher than an erased predetermined level, the erase operation continues, otherwise, over-erasing occurs.

9. The method according to claim 3, wherein there is a validation step, if a threshold voltage of an erased cell is higher than an erased predetermined level, the erase operation continues, otherwise, over-erasing occurs.

* * * * *